US008097305B2

(12) United States Patent
Meyer et al.

(10) Patent No.: US 8,097,305 B2
(45) Date of Patent: Jan. 17, 2012

(54) METHOD FOR PRODUCING A THIN-FILM CHALCOPYRITE COMPOUND

(75) Inventors: Tobias Meyer, Fechy (CH); Tiwari Ayodhya, Zurich (CH); Marc Kaelin, Zurich (CH)

(73) Assignee: Solaronix S.A., Aubonne (CH)

( * ) Notice: Subject to any disclaimer, the term of this patent is extended or adjusted under 35 U.S.C. 154(b) by 609 days.

(21) Appl. No.: 11/579,457

(22) PCT Filed: May 3, 2005

(86) PCT No.: PCT/IB2005/051437
§ 371 (c)(1),
(2), (4) Date: Dec. 29, 2006

(87) PCT Pub. No.: WO2005/106967
PCT Pub. Date: Nov. 10, 2005

(65) Prior Publication Data
US 2008/0044570 A1   Feb. 21, 2008

(30) Foreign Application Priority Data

May 3, 2004   (CH) ..................... 0783/04

(51) Int. Cl.
*B05D 3/02*   (2006.01)
(52) U.S. Cl. .................................... 427/376.3
(58) Field of Classification Search ............... 427/376.3
See application file for complete search history.

(56) References Cited

U.S. PATENT DOCUMENTS

| 2,081,985 | A | * | 6/1937 | Cornwell ...................... 428/536 |
| 4,061,588 | A | * | 12/1977 | Gulla .......................... 106/1.11 |
| 4,242,374 | A |   | 12/1980 | Sansregret |
| 4,335,266 | A |   | 6/1982 | Mickelsen et al. |
| 4,368,216 | A |   | 1/1983 | Manassen et al. |
| 5,028,274 | A | * | 7/1991 | Basol et al. ................... 136/264 |
| 5,147,851 | A | * | 9/1992 | Yamana et al. ............... 505/220 |
| 5,871,630 | A |   | 2/1999 | Bhattacharya et al. |
| 5,910,336 | A |   | 6/1999 | Ishihara et al. |
| 6,127,202 | A |   | 10/2000 | Kapur et al. |
| 6,379,635 | B2 |   | 4/2002 | O'Brien et al. |
| 2006/0057766 | A1 | * | 3/2006 | Jia et al. ........................ 438/85 |

FOREIGN PATENT DOCUMENTS

WO   WO 96/06454   2/1996

OTHER PUBLICATIONS

Beck et al. "Thin-film Copper Indium Diselenide Prepared by Selenization of Copper Indium Oxide Formed by Spray Pyrolysis" Thin Solid Films 272 (1996) pp. 71-82.*
Kaelin et al. "Low-cost CIGS Solar Cells by Paste Coating and Selenization" Thin Solid Films 480-481 (2005) p. 486-490; available online Dec. 2, 2004.*
Penndorf J et al: "CuInS2 thin film formation on a Cu tape substrate for photovoltaic applications" Solar Energy Materials and Solar Cells, Elsevier Science Publishers, Amsterdam, NL, vol. 53, No. 3-4, Jun. 1998, pp. 285-298, XP004148855 ISSN: 0927-0248 p. 287-p. 298.
Weng S et al: "Preparation of copper indium diselenide by selenisation of copper indium oxide" Journal of Applied Physics, American Institute of Physics, New York, US, vol. 74, No. 3, Aug. 1, 1993, pp. 2046-2052, XP002078864 ISSN: 0021-8979.
Boiko M E et al: "Thermal oxidation of CuInSe2: Experiment and physico-chemical model" Solar Energy Materials and Solar Cells, Elsevier Science Publishers, Amsterdam, NL, vol. 41-42, Jun. 1996, pp. 307-314, XP004007949 ISSN: 0927-0248.
Oliveira M C F et al: "A voltammetric study of the electrodeposition of CuInSe2 in a citrate electrolyte" Preparation and Characterization, Elsevier Sequoia, NL., vol. 405, No. 1-2, Feb. 22, 2002, pp. 129-134, XP004342255 issn: 0040-6090 p. 130.
Ramanathan, Kannan, et al., "Properties of 19.2% Efficiency ZnO/ CdS/CuInGaSe2 Thin-film Solar Cells", *Progress in Photovoltaics: Research and Applications*, Ub. John Wiley & Sons, Ltd., 2003, 11, pp. 225-230.
Powalla, Michael et al., "New Developments in CIGS Thin-Film Solar Cell Technology" Proceedings of the $3^{rd}$ WCPEC, Osaka, Japan, 2003, pp. 1-6.
Kushiya, Katsumi et al., "Progress in Large-Area Cu(InGa)Sc2- based Thin-Film Modules With the Efficiency of Over 13%", Proceedings of the $3^{rd}$ WCPEC, Osaka, Japan, 2003, pp. 1-6.
Penndorf J et al: "CuInS2 thin film formation on a Cu tape substrate for photovoltaic applications" Solar Energy Materials and Solar Cells, Elsevier Science Publishers, Amsterdam, NL, vol. 53, No. 3-4, Jun. 1998, pp. 285-298, XP004148855 ISSN: 0927-0248 p. 287-p. 296.
Weng S et al: "Preparation of copper indium diselenide by selenisation of copper indium oxide" Journal of Applied Physics, American Institute of Physics, New York, US, vol. 74, No. 3, Aug. 1, 1993, pp. 2046-2052, XP002078864 ISSN: 0021-8979 p. 2046-p. 2047.
Boiko M E et al: "Thermal oxidation of CuInSe2: Experiment and physico-chemical model" Solar Energy Materials and Solar Cells, Elsevier Science Publishers, Amsterdam, NL, vol. 41-42, Jun. 1996, pp. 307-314, XP004007949 ISSN: 0927-0248. Oliveira M C F et al: "A voltammetric study of the electrodeposition of CuInSe2 in a citrate electrolyte" Preparation and Characterization, Elsevier Sequoia, NL., vol. 405, No. 1-2, Feb. 22, 2002, pp. 129-134, XP004342255 issn: 0040-6090 p. 130.
K. Ramanathan et al., "Photovoltaics", 2003, 11, p. 225.
Powalla et al., "Proceedings of the $3^{rd}$ WCPEC", Osaka, Japan, 2003.
Kushiya et al., "Proceedings of the $3^{rd}$ WCPEC", Osaka, Japan, 2003.

* cited by examiner

*Primary Examiner* — Nathan Empie
(74) *Attorney, Agent, or Firm* — Davis & Bujold, P.L.L.C.

(57) ABSTRACT

The invention concerns a method which consists in depositing on a substrate a solution containing metal mineral salts constituting chalcopyrite and an organic binder; then drying to obtain a solid film on the substrate; and finally contacting the film with an atmosphere containing one or more elements of group 16 of the periodic table and forming chalcopyrite by thermal reaction.

2 Claims, No Drawings

METHOD FOR PRODUCING A THIN-FILM CHALCOPYRITE COMPOUND

This application is a national stage completion of PCT Application No. PCT/IB2005/051437 filed May 3, 2005, which claims priority from Swiss Application No. 00783/04 filed May 3, 2004.

BACKGROUND OF THE INVENTION

Chalcopyrite compounds, particularly deselinized copper and indium $CuInSe_2$, also called CIS, and its alloys with gallium ("CIGS") and sulfur (CIGSS) are promising candidates when used as a light-absorbing layer in photovoltaic cells in thin films. U.S. Pat. No. 4,335,266 is one example that describes the technology of CIS cells. Because of their high coefficient of absorption, a 1 to 2 micrometer thickness of CIGS chalcopyrite is sufficient to absorb all incident light. By changing the ratio of In/Ga and Se/S, a large range of values (1 to 2.4 eV) for the energy gap ("band-gap") can be obtained, and structures with a gradual band-gap are used in high output photovoltaic cells. Solar cells possessing a layer of polycrystalline CIGS have demonstrated conversion outputs exceeding 19%, as described by K. Ramanathan et al., *Photovoltaics*, 2003, 11, p. 225. The first industries have emerged and their production of solar cells with thin CIGS films is based on co-evaporation and selenization methods requiring a high vacuum, as described by Powalla et al., Proceedings of the $3^{rd}$ WCPEC, Osaka, Japan, 2003, in publication, and by Kushiya et al. Proceedings of the $3^{rd}$ WCPEC, Osaka, Japan, 2003. Current CIGS solar modules have average outputs of 10 to 13%, with the goal being to obtain 13 to 15% with lower production costs than with crystalline silicon. These high output CIGS modules are obtained with expensive vacuumized equipment and sophisticated method controls; furthermore, from 20 to 40% of the primary materials are inevitably wasted. In order to reduce manufacturing costs, alternative deposition methods based on methods that do not rely on high vacuums have been proposed and studied. In general, these methods should allow the CIGS chalcopyrite layer to be quickly and simply deposited while completely using up the primary materials such as indium and gallium, which are relatively rare and expensive elements. Aside from the well-known methods such as electrochemical procedures, see for example U.S. Pat. No. 5,871,630 and pyrolysis by spraying, for example, as in U.S. Pat. Nos. 4,242,374 or 6,379,635, methods based on deposition of a paste have attracted attention these last few years, since outputs in excess of 13% have been obtained. As described in U.S. Pat. No. 6,127,202, Kapur et al. have developed a procedure where a paste containing nanocrystalline metal oxide powder is first deposited on a substrate by spreading it ("doctor-blade"), then a treatment in a hydrogen atmosphere allows the oxides to be reduced to a metal layer which is then heated in a diluted $H_2Se$ atmosphere. This method requires, first, the elaboration of nanometric metal oxide powders in the appropriate Cu/In and Cu/Ga ratio, and second, reduction in a hydrogenised atmosphere, followed by "selenization," requiring at least two heated vacuum environments for safety, since the gas used, $H_2Se$, is highly toxic, making the procedure costly. Furthermore, the fact that the deposition of metal oxide paste must be treated in two stages considerably lengthens the time required for the cycle to produce the thin film of chalcopyrite substrate.

In another procedure described in U.S. Pat. No. 5,910,336, organometallic compounds are dissolved in an organic solvent, then deposited on a substrate by spinning ("spin-coating") or by plunging ("dip-coating"), and after pyrolysis in an inert or reductive atmosphere, the resulting metal alloy is selenized in an oven and the chalcopyrite layer thus formed is completed into solar cells with an output of up to 9%. This method also requires fairly toxic and expensive metal-organic precursors, and the two-step procedure (reduction and then selenization) adversely affects deposition speed and adds to the cost.

DETAILED DESCRIPTION OF THE INVENTION

The present invention relates to a rapid method that is economical in its use of primary materials and requires only simple equipment to produce a thin film of chalcopyrite on a substrate. The invention is characterized by the use of a solution containing metal mineral salts and an organic binder dissolved in a polar solvent.

These mineral salts may be halogens, nitrates, cyanides, cyanates or even thiocyanates or seleno-cyanates that may be either anhydrous or hydrated.

This solution is deposited on the substrate using an impression process such as serigraphy, stenciling, tampography, flexography, spin-coating, or methods for spreading liquid film ("doctor-blade" or "cup-coating"), or using a combination of several impression methods. Actually any method allowing a liquid to be transferred to a surface can be used, so long as the solution of metal mineral salts also contains an organic binder allowing the viscosity and rheology of said solution to be adjusted so as to be compatible with the impression or deposition method selected. The organic binder is typically selected from among celluloses, cellulose substitutes, polyvinyl alcohols, polyethlyenoxides, polyacrylonitriles, polysaccharides and nitrocelluloses soluble in the appropriate solvent. This solvent may be either water or an organic compound selected from aliphatic alcohols, polyglycols, polyethers, polyols, esters, ethers, ketones, nitriles, or alkoxy alcohols. This is not an exhaustive list; any organic solvent may be used so long as it ensures that the metal mineral salts and organic binders are soluble. It is also possible to have a mixture of water and one or more of the previously cited organic compounds. In order to obtain a thin layer of chalcopyrite according to the invention, the solution containing the metal mineral salts is deposited on the substrate, then dried to obtain a solid layer containing metal salts. The substrate thus treated is placed into contact with an atmosphere containing one or more of the elements in Group 16 (formerly Group VI) of the Periodic Table, typically selenium or sulfur, or a mixture of both, and heated, causing a reaction that transforms the layer containing the metal salts into a thin and compact film of chalcopyrite. In a case where the salts contain copper, indium, and possibly also gallium in the appropriate atomic proportions and the thermal treatment atmosphere contains selenium, a $Cu(InGa)Se_2$ type chalcopyrite is obtained with physical and electrical properties favorable for the manufacture of photovoltaic solar cells. The substrate is not limited to molybdenum deposited on glass such as that is used in CIGS photovoltaic cells. Any substrate offering the required chemical resistance during thermal treatment in an atmosphere containing the one or more elements from Group 16 may be covered with a thin coating of chalcopyrite according to the invention.

The present invention is not limited to CIGS type chalcopyrites, but may extend to compounds such as CdTe, HgCdTe or $Cu_2ZnSnSe_4$, for example. It is also possible to use mixed oxides such as $CuAlO_2$, or even $AgInS_2$ type sulfides when using corresponding metal salts.

The applications for chalcopyrites obtained according to the invention are not limited to photovoltaic cells, clearly, other applications are possible. For example, the chalcopyrites may be used as infrared detectors such as with HgCdTe, transparent electrically conductive coatings such as $CuAlO_2$, photovoltaic sensors such as CdTe, or even light emitters in luminous diode structures, or as semi-conductive material in electrical resistors or even transistors by using suitable doping. If metals such as Fe, Ni, Co, Cr enter into the composition of the chalcopyrite, it is also possible for it to have magnetic properties.

All of the following examples have been prepared from plates of sodo-calcic glass coated with a layer of molybdenum deposited by cathode pulverization. The thin films of chalcopyrite obtained using the method of the invention have served in photovoltaic cells, given that the chalcopyrite coatings have been optimized and customized for this application.

The general procedure according to the invention for producing chalcopyrite is divided into four steps:

Step 1: Preparation of a solution containing the metal mineral salt or salts and the organic binder or binders in a polar solvent.

Step 2: Deposition of this solution onto the substrate using a suitable method of impression to ensure a constant, defined thickness of liquid film on the substrate.

Step 3: Drying the substrate with its liquid film in air or in an inert atmosphere in order to obtain a compact and solid film containing the metal salt or salts.

Step 4: Thermal treatment in an atmosphere containing the element or elements of Group 16 of the Periodic Table in order to form chalcopyrite.

EXAMPLE 1

In 25 Ml. (0.8454 oz) of methanol (Fluka 99.5%) 1.106 g (0.0390 ounce) of anhydrous indium chloride (III) $InCl_3$ (Aldrich, 99.999%) are dissolved, followed by 0.938 g (0.0331 ounce) of hemi-pentahdyrate copper nitrate (II) $Cu(NO_3)_2$ 2.5 $H_2O$ (Aldrich, 99.99%), then 3 g (0.01058 ounce) of ethylcellulose "Ethocel®" (Fluka) with a standard 5-15 mPas viscosity are added to the solution in order to adjust consistency.

This solution is deposited on the molybdenum coated glass by spreading the solution with a glass stick that serves as a blade and by using 100 micrometer spacers which define the thickness of the liquid film thus obtained. A volume of approximately 1 ml (0.0338 oz) of solution is sufficient to cover 10 $cm^2$ (1.55 $in^2$) of substrate. The substrate with the liquid film is immediately dried at 100-120° C. (212-248° F.) for 2 to 3 minutes, then it is heated to 250° C. (482° F.) in the air for 1 to 2 minutes.

Finally, the substrate thus treated is placed in a heated graphite environment containing 0.5 grams (0.0176 ounce) of sulfur (99.5%, Fluka) and after 10 minutes at 500° C. (932° F.), the substrate is covered with a thin film (approximately 1 micrometer) of polycrystalline chalcopyrite $CuInS_2$.

Analysis using an EDX sweeping electronic microscope and X-ray diffraction permits identification of the chalcopyrite obtained in this manner.

EXAMPLE 2

0.256 g (0.0090 ounce) of hydrated gallium nitrate (III) (99.999% Aldrich) are dissolved in 25 ml (0.8454 oz) of methanol (Fluka, 99.5%), followed by 0.886 g (0.0313 ounce) of anhydrous indium chloride (III) $InCl_3$ (Aldrich, 99.999%), which permits an atomic ratio of In/Ga of 4, followed by 0.938 g (0.0331 ounce) of hemi-pentahydrate copper nitrate (II) $Cu(NO_3)_2$ 2.5 $H_2O$ (Aldrich, 99.99%), which permits an atomic ratio of Cu/(In+Ga) of 1, then 3 g (0.1058 ounce) of ethylcellulose "Ethocel®" (Fluka) with a standard viscosity of 5-15 mPas is added to the solution in order to adjust the consistency.

As in the preceding example, this solution is deposited on the molybdenum coated glass by spreading the solution with a glass stick which serves as a blade and by using 100 micrometer spacers which define the thickness of the liquid film thus obtained. The substrate with the liquid film is immediately air-dried by passing it through an ambient temperature of 120° C. (248° F.) for 2 minutes, then it is heated by passing it in open air at 120° C. to 300° C. (148° F. to 572° F.) for 3 minutes. Finally, the substrate thus treated is placed in a nitrogen-filled glass tube and maintained at 10 mbar (0.145 psi) This tube comprises two temperature zones. The substrate is placed in one and in the other, a cupel containing 0.2 g (0.0071 ounce) of selenium (99.9%, Aldrich). The zone with the selenium is maintained at 300° C. (572° F.) and the substrate is heated to 560° C. (1040° F.) for 10 minutes. After this thermal treatment, also called "selenization" the substrate is covered with a thin layer (about 1 micrometer) of polycrystalline chalcopyrite $CuIn_{0.8}Ga_{0.2}Se_2$ with favorable photovoltaic properties.

EXAMPLE 3

A first solution of 5 ml (0.1691 oz) of methanol (Fluka, 99.5%) containing 0.767 g (0.0271 ounce) of hydrated gallium nitrate (III) (99.999%, Aldrich), 0.885 g (0.0312 ounce) of anhydrous indium chloride (III) $InCl_3$ (Aldrich, 99.999%) and 0.938 (0.0331 ounce) g of hemipentahydrate copper nitrate (II) $Cu(No_3)_2$ 2.5 $H_2O$ (Aldrich, 99.99%) is prepared. A second solution is prepared with 5 ml. (0.1691 oz) of 1-pentanol (99%, Fluka) containing the same quantities of metal salts as the first solution and additionally containing 0.5 g (0.0176 ounce) of ethylcellulose "Ethocel®" (Fluka) with a standard viscosity of 5-15 mPas.

The solution to be deposited is formulated by mixing in a ratio of 1:2 the first and second solutions, in order to obtain the desired viscosity and rheology.

Deposition on the molybdenum-coated glass, drying and selenization take place as described in Example 2. The resulting chalcopyrite possesses favorable photovoltaic properties once a thin 50 mm (1.969 in) film of CdS has been applied to it using the well-known "chemical bath" method, followed by a transparent ZnO-based transparent contact doped with aluminum deposited by cathode pulverization. Such a photovoltaic cell has demonstrated a conversion output of 6.7% under standard 1000 $W/m^2$ (92.94 $W/ft^2$) lighting.

The invention claimed is:

1. A method of producing a film of chalcopyrite composition on a substrate, the method comprising the steps of:
   preparing a substrate by depositing molybdenum in a thin layer on one of glass and a polymer substrate;
   preparing a metal mineral salt solution by mixing in a 1:2 ratio a solution A and a solution B, the solution A consisting of 5 mil of methanol containing 0.767 g of hydrated gallium nitrate (III), 0.885 g of anhydrous indium chloride (III), and 0.938 g of hemi-pentahydrate copper nitrate (II); and the solution B is prepared with 5 ml of 1-pentanol containing 0.767 g of hydrated gallium nitrate (III), 0.885 g of anhydrous indium chloride (III), 0.938 g of hemi-pentahydrate copper chloride (II), and 0.5 g of ethylcellulose with a standardized viscosity of 5-15 mPas (measured at 25° C. at a proportion of 5% in an 80:20 toluene/EtOH mixture);

depositing the metal mineral salt solution on the substrate and spreading the metal mineral salt solution into a 100 micrometer thick liquid film;

drying the liquid film of the metal mineral salt solution deposited on the molybdenum coated substrate at a temperature of between 100-120° C. for 2-3 minutes and further drying the liquid film at a temperature of 250° C. for 1-2 minutes to form a solid layer;

forming chalcopyrite by placing the molybdenum coated substrate in a graphite environment containing 0.5 grams of sulfur for 10 minutes, the graphite environment being heated to a temperature of 500° C. to thermally react the metal mineral salts in the solid layer.

2. The method according to claim 1, further comprising the step of placing the thin film of chalcopyrite in photovoltaic cells.

* * * * *